(12) United States Patent
Odagawa et al.

(10) Patent No.: US 7,865,345 B2
(45) Date of Patent: Jan. 4, 2011

(54) SIMULATION APPARATUS AND METHOD

(75) Inventors: Masayuki Odagawa, Yokohama (JP); Oki Minabe, Kita-ku (JP)

(73) Assignee: Canon Kabushiki Kaisha (JP)

( * ) Notice: Subject to any disclaimer, the term of this patent is extended or adjusted under 35 U.S.C. 154(b) by 596 days.

(21) Appl. No.: 11/221,686

(22) Filed: Sep. 8, 2005

(65) Prior Publication Data

US 2006/0052995 A1   Mar. 9, 2006

(30) Foreign Application Priority Data

Sep. 9, 2004   (JP)   ............... 2004-262953

(51) Int. Cl.
*G06F 17/50* (2006.01)
*G06F 9/455* (2006.01)
*G06G 7/62* (2006.01)

(52) U.S. Cl. .......................... 703/13; 703/25

(58) Field of Classification Search ............ 703/13, 703/25
See application file for complete search history.

(56) References Cited

U.S. PATENT DOCUMENTS

| | | | | |
|---|---|---|---|---|
| 5,768,500 A | * | 6/1998 | Agrawal et al. | 714/47 |
| 5,958,035 A | * | 9/1999 | Carter et al. | 710/306 |
| 6,151,567 A | * | 11/2000 | Ames et al. | 703/13 |
| 6,272,112 B1 | * | 8/2001 | Orita | 370/243 |
| 6,434,517 B1 | * | 8/2002 | Le | 703/21 |
| 6,845,341 B2 | * | 1/2005 | Beverly et al. | 702/182 |
| 7,055,116 B2 | * | 5/2006 | Marschner et al. | 716/4 |
| 2003/0154401 A1 | * | 8/2003 | Hartman et al. | 713/201 |
| 2004/0054500 A1 | * | 3/2004 | Beverly et al. | 702/182 |
| 2007/0162475 A1 | * | 7/2007 | Jacobson et al. | 707/101 |

FOREIGN PATENT DOCUMENTS

| | | |
|---|---|---|
| JP | 2002-312416 A | 10/2002 |
| JP | 2003-15968 A | 1/2003 |
| JP | 2005-108007 A | 4/2005 |

OTHER PUBLICATIONS

Cochrane, Allan et al, AMBA AHB Cycle Level Interface (AHB CLI) Specification, released on Jul. 15, 2003, ARM Ltd. 2003.
Grounds for Rejection issued in corresponding Japanese patent application No. 2004-262953, dated Aug. 1, 2008.

* cited by examiner

*Primary Examiner*—David Silver
(74) *Attorney, Agent, or Firm*—Rossi, Kimms & McDowell LLP

(57) ABSTRACT

Transaction-level simulation in which communication over a bus is performed by using a transaction. The transaction includes information indicating whether information is attribute information that is mapped to hardware and includes attribute information that is not mapped to hardware. The transaction is received, time information which is attribute that is not mapped to hardware is read from the transaction, and the result of the simulation based on the read time information is outputted.

5 Claims, 16 Drawing Sheets

FIG. 1

MASTER INTERFACE

| | |
|---|---|
| request() | ISSUED FOR REQUESTING ACCESS TO BUS |
| has_grant() | ISSUED FOR GRANTING ACCESS TO BUS |
| end_request() | ISSUED WHEN BUS ACCESS REQUEST ENDS |
| lock() | ISSUED FOR LOCKING BUS ACCESS |
| unlock() | ISSUED FOR UNLOCKING BUS ACCESS |
| busy() | ISSUED WHEN MASTER IS BUSY |
| idle() | ISSUED WHEN MASTER IS IDLE |
| init_transaction() | ISSUED WHEN MASTER INITIATES TRANSACTION TO BUS |
| set_data() | ISSUED WHEN TRANSFERRING DATA |
| set_protection() | ISSUED WHEN MASTER SETS PROTECTION |
| reqsponse() | ISSUED WHEN BUS SENT RESPONSE TO MASTER |

SLAVE INTERFACE

| | |
|---|---|
| read() | ISSUED WHEN MAKING READ ACCESS TO SLAVE |
| write() | ISSUED WHEN MAKING WRITE ACCESS TO SLAVE |
| control_info() | ISSUE BUS CONTROL SIGNAL |
| set_data() | ISSUED WHEN TRANSFERRING DATA |
| response() | ISSUED WHEN SENDING RESPONSE TO MASTER |
| split_response() | ISSUED WHEN SENDING RESPONSE TO MASTER (SPLIT TRANSFER) |

ARBITER AND DECODER INTERFACE

| | |
|---|---|
| arbitrate() | ISSUED FOR REQUESTING ACCESS TO BUS FROM MASTER |
| get_slave() | ISSUED WHEN CONNECTING APPROPRIATE SLAVE BASED ON RESULT OF ADDRESS DECODING. |

Prior Art

FIG. 2

MASTER INTERFACE

| Method | Attribute | Output | Input |
|---|---|---|---|
| request() | | HBUSREQm | |
| end_request() | | HBUSREQm | |
| lock() | | HLOCKm | |
| unlock() | | HLOCKm | |
| busy() | | HTRANSm | |
| idle() | | HTRANSm | |
| init_transaction() | ahb_hwrite<br>ahb_data_t<br>ahb_addr_t<br>ahb_hburst<br>ahb_hsize | HWRITEm<br>HWDATAm<br>HADDRm<br>HBURSTm<br>HSIZEm | HRDATAm |
| set_data() | | HWDATAm | HRDATAm |
| set_protection() | | HPROTm | |
| response() | ahb_hresp | | HREADY<br>HRESP |
| has_grant() | | | HGRANTm |

SLAVE INTERFACE

| Method | Attribute | Output | Input |
|---|---|---|---|
| read() | ahb_addr_t<br>ahb_hsize_t | | HWRITE<br>HADDR<br>HSIZE |
| write() | ahb_addr_t<br>ahb_hsize_t | | HWRITE<br>HADDR<br>HSIZE |
| control_inf() | ahb_hburst<br>ahb_htrans<br>ahb_prot<br>master id<br>lock | | HBURST<br>HTRANS<br>HPROT<br>HMASTER<br>HMASTLOCK<br>HSELs<br>HREADY |
| set_data() | | HRDATA | HWDATA |
| response() | ahb_hresp | HREADYs<br>HRESPs | |
| split_response() | | HSPLITs | |

ARBITER AND DECODER INTERFACE

| Method | Attribute | Output | Input |
|---|---|---|---|
| arbitrate() | ahb_addr_t<br>ahb_htrans<br>ahb_hburst<br>ahb_hresp<br>ready | HMASTLOCK | HADDR<br>HTRANS<br>HBURST<br>HRESP<br>HREADY |
| get_slave() | | HSEL | HADDR |

Prior Art

F I G. 4

| TIME | Master 1 | Master 2 | AHB |
|---|---|---|---|
| T1 | request() | idle() | response()[OKAY,READY]<br>arbitrate() |
| T2 |  | request() | arbitrate()[grant M1] |
| T3 | has_grant()[TRUE]<br>end_request()<br>set_protection()<br>init_transaction() |  | get_slave()<br>write()[address A1]<br>control_info()[NONSEQ,INCR4] |
| T4 | set_data()[A1] |  | set_data()[A1]<br>write()[address A2]<br>control_info[SEQ] |
| T5 | set_data()[A2] |  | set_data()[A2]<br>write()[address A3]<br>control_info[SEQ] |
| T6 | set_data()[A3] |  | set_data()[A3]<br>write()[address A4]<br>control_info[SEQ]<br>arbitrate()[grant M2] |
| T7 | set_data()[A4] | has_grant()[TRUE]<br>set_protection()<br>init_transaction() | set_data()[A4]<br>response()[OKAY,NOT-READY] |
| T8 |  |  | response()[OKAY,NOT- |
| T9 |  |  | response()[OKAY,READY]<br>get_slave()<br>write()[address B1]<br>control_info()[NONSEQ,INCR] |
| T10 |  | set_data()[B1] | set_data()[B1]<br>write()[address B2]<br>control_info()[SEQ,INCR] |

Prior Art
FIG. 6

DIRECT ACCESS

| direct_read() | DIRECTLY READ REGARDLESS OF BUS PROTOCOL |
|---|---|
| direct_write() | DIRECTLY WRITE REGARDLESS OF BUS PROTOCOL |

FIG. 9

| TIME | SOURCE MODEL | DEST MODEL | TRANSACTION | ADDRESS | BYTE ENABLE | DATA |
|---|---|---|---|---|---|---|
| 13:13:10 | MASTER1 | SLAVE1 | WRITE | 0xff00_0000 | 0xffff | 0x1234 |
| 13:13:20 | MASTER2 | SLAVE1 | READ | 0xff00_0000 | 0xffff | |
| 13:13:30 | SLAVE1 | MASTER2 | READ DATA | | | 0x1234 |
| 13:13:30 | MASTER2 | SLAVE2 | WRITE | 0X1000_0000 | 0xffff | 0x5555 |
| 13:13:50 | MASTER1 | SLAVE2 | WRITE | 0X1000_0004 | 0xffff | 0xAAAA |
| 13:14:00 | MASTER1 | SLAVE2 | READ | 0X1000_0000 | 0xffff | |
| 13:14:10 | SLAVE2 | MASTER1 | READ DATA | | | 0x5555 |
| 13:14:20 | MASTER2 | SLAVE2 | READ | 0X1000_0004 | 0xffff | |
| 13:14:30 | SLAVE2 | MASTER2 | READ DATA | | | 0xAAAA |

901

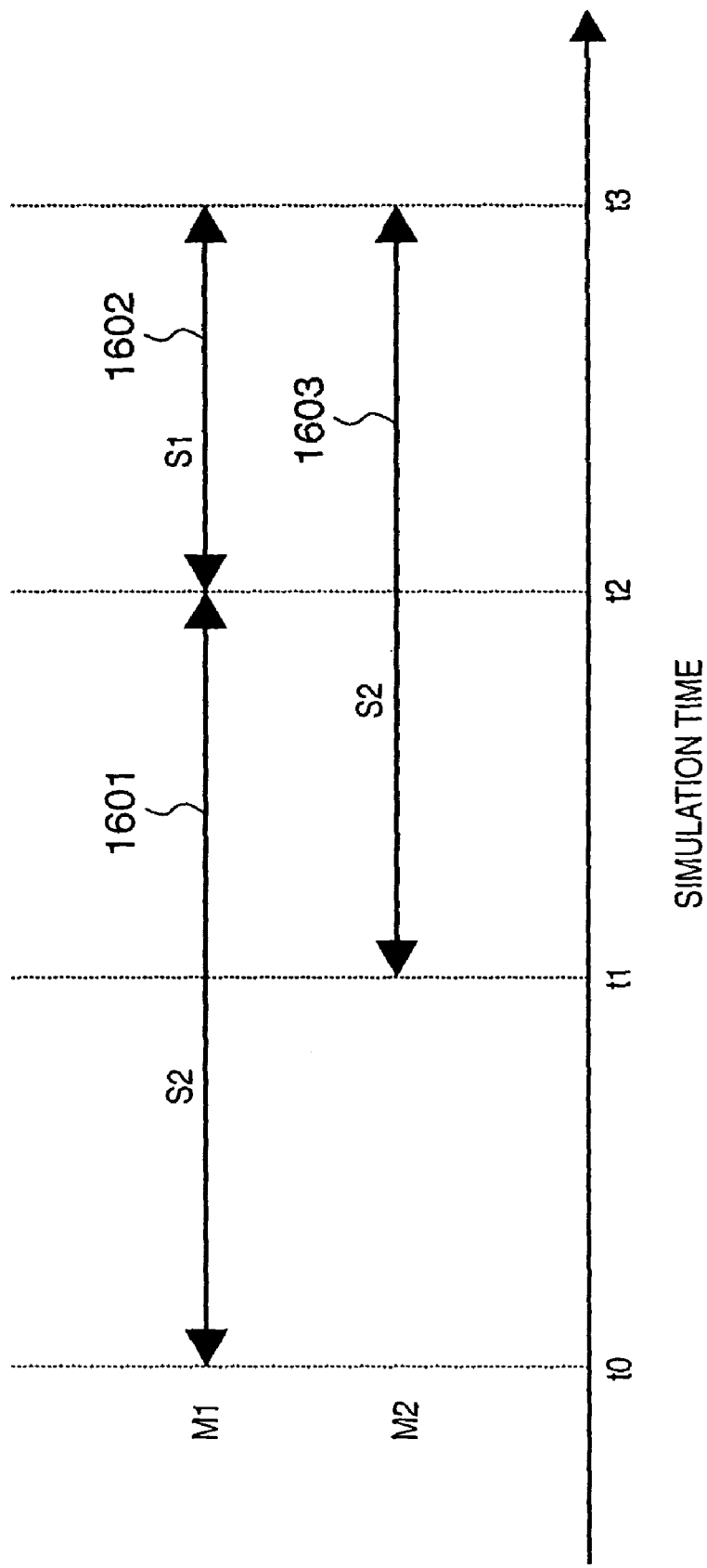

SIMULATION APPARATUS AND METHOD

FIELD OF THE INVENTION

The present invention relates to an apparatus and a method in which a hardware system including logic circuits performs simulations by using simulation models written in a system description language at a high abstraction level.

BACKGROUND OF THE INVENTION

The packaging density of LSIs has been increased with the advance of process technology. This greater chip density has made it possible to integrate a system that used to be implemented at the board-level into a single chip as a system LSI. The variety of functional modules included in a chip and the scale of circuitry has also increased. Along with this increase has come widespread replacement of conventional designs using hardware description languages such as Verilog-HDL and VHDL by designs in system description languages such as System C and Spec C.

Examples of well-known design support tools using system description languages include CoCentric from Synopsys and ConvergenSC from CoWare. System LSI can be designed by inputting modules written in a system description language on a block diagram input screen.

Once the design of the system LSI is completed, a simulation model can be generated from the design support tool, a simulator is activated to perform simulation to check the functions and performance of the designed system LSI. That is, before building an actual hardware system, a simulation of the system is performed to evaluate the system, thereby avoiding defects or performance deficiencies.

The following three levels of module descriptions in the system description languages are known.

Transaction Level (TL):

At this abstraction level, bus communications between modules are modeled to describe functions. Because this level functions based on the start and end times of communications and on communication data, the clock-by-clock accuracy is low. Because functions are simulated based on events, the simulation speed is very high. The transaction level is suitable for evaluating the entire system because operations of the system agree with operations of actual hardware.

According to the definition by ARM Limited, the transaction level is subdivided and corresponds to PV (programmer's view), PVT (programmers view+timing), and CL (cycle level).

Bus Cycle Accurate (BCA):

At this abstraction level, functions are described as input and output events. The system can be accurately simulated at input and output sections.

This level is equivalent to CC (Cycle-Callable) in the definition by ARM Limited.

Register Transfer Level (RTL):

At this abstraction level, circuits are described in terms of synchronous transmissions between register files. Functional behavior can be simulated with considerably high accuracy. Because functions are simulated on a clock-by-clock basis, very fast simulation can be performed.

This level is equivalent to RT (RTL event-driven) in the definition by ARM Limited.

Generally, the higher the abstraction level, the faster the simulation; the lower the abstraction level, the higher the accuracy of simulation.

Simulation models used for simulation of a system are described at transaction level.

Examples of widely know transaction-level simulation models include an AMBA bus released by ARM Limited (AMBA AHB Cycle Level Interface (AHB CLI) Specification, released on Jul. 15, 2003).

FIG. 1 shows bus transactions defined in AHB CLI. The transaction methods listed in FIG. 1 can be mapped to hardware signals specified in the AMBA AHB bus protocol. FIG. 2 shows correspondence among transaction methods, attributes, and hardware signals. As shown in FIG. 2, each attribute and each method itself correspond to at least one hardware signal. The methods can be used to simulate bus behavior.

A method for simulating the behavior of bus will be described with reference to FIGS. 3 and 4. FIG. 3 shows correspondence between the transaction methods and signal waveforms. FIG. 4 is a diagram for explaining simulation using transaction methods.

At time T1, bus master 1 issues a request onto the bus. The bus master 1 calls the method request ( ) and issues it to the bus. This corresponds to assertion of the signal HBUSREQ_M1. The bus causes an arbiter to start arbitration (arbitrate ( )). The bus issues the method response ( ) [OKAY, READY] to the master. This corresponds to the signals HREADY and HRESP.

At time T2, master 2 issues a request (request ( )) onto the bus. This corresponds to assertion of the signal HBUSREQ_M2. At the same time, the bus provides grant to master 1 (arbitrate ( ) [grant M1]). This corresponds to assertion of the signal HGRANT_M1.

At time T3, master 1 detects the grant (has_grant ( ) [TRUE]) and ends the request (end_request ( )). This corresponds to deassertion of the signal HBUSEREQ_M1. Master 1 starts a transaction (set_protection ( ) and init_transaction ( )). These correspond to signals such as HPROTO, HTRANS, HADDR, HABURST, HWRITE, and HSIZE. At the same time, the bus performs address decoding and issues the transaction to a slave (write ( ) [address A1] and control_info [NONSEQ, INCR4]).

During the period from time T4 to time T7, master 1 sends data onto the bus (set_data ( )). This corresponds to the signal HWDATA. Then, the bus transfers the data sent from the master to the slave (set_data ( )).

At time T6, the bus provides grant to master 2 (arbitrate ( ) [grant M2]). At time T7, master 2 detects the grant and starts access to the bus.

In this way, the transaction methods have the same functions as the behavior of hardware signals. It can be seen that the methods and attributes can be mapped to hardware signals.

In AHB CLI, methods for changing the configuration of busses are provided in addition to the transaction methods. These methods can be used to change the address width, data width, address map of a bus.

FIG. 5 shows hardware configuration methods. As shown in FIG. 5, the methods can be categorized as methods that are executed during elaboration for a simulator to read a system model or methods that can be used during simulation. Methods that changes bus configuration while simulation is being executed are initialize_map ( ) for decoder and priority ( ) and set_default_master ( ) for arbiter.

These methods relate to actual hardware operation. The method initialize_map ( ) corresponds to the signal remap and the methods priority ( ) and set_default_master ( ) correspond to register access signals in the arbiter.

Methods used for verification are also provided in the AHB CLI. These methods correspond to backdoor functions commonly used for verification of hardware. They can be used to directly read and write data at a specified address regardless of a bus protocol.

FIG. 6 shows verification methods. Masters use three arguments: address, pointer to data, and transfer size. They relate to hardware. Slaves use four arguments: master ID, address, pointer to data, and transfer size, which also relate to hardware.

However, these conventional techniques involve creation of special monitors for monitoring transactions to verify a system or individual modules. Even for RTL which is a lower abstraction level, a verification monitor must be created. Thus, the conventional techniques have the problem of requiring extra labor for developing monitors.

Furthermore, a monitor itself is typically implemented as a functional module. However, the information that the only function module is holding may be required, to analyze the information regarded as the object of the monitor. For example, although bus model includes the function of an address decoder within it, address map information cannot be obtained by externally observing transactions. In such a case, the monitor and functional modules must share information. However, implementing such a monitor is considerably laborsome.

Moreover, because simulation at transaction level is performed by calling functions, known as methods, of modules, a monitor cannot readily be created. While monitoring methods are provided in the AHB CLI, such methods are not provided in most cases.

Verification methods are defined in the AHB CLI and the like. However, those methods must be called during simulation of actual hardware operation in such a manner the called methods do not affect the results of the simulation. Accordingly, verification using these methods is complex.

Moreover, verification through heavy use of methods increases the number of events during simulation and therefore significantly affects the speed of the simulation, resulting in reduction in simulation speed.

Another method that verifies a system or modules without using methods is known in which information about transactions of each module are dumped as a waveform and the waveform is observed. However, it is almost impossible to verify a vast number of results of system simulation by observing their waveforms. Also, holding waveform information in files requires a large amount of disk memory and it is difficult to perform simulation for a sufficient amount of time.

Determination cannot be made from such comparison as to whether latency in one functional module was caused by contention with another functional module or whether the latency is a minimum latency required by the functional module. Therefore, information obtained from such comparison is insufficient for a designer to analyze the performance of a system and optimize system configuration and processing sequences.

Because of the expanded scale and higher functionality of recent system LDIs, the number of functional modules and buses in a system has been increasing. It is difficult to analyze and verify such complex systems by using the conventional approaches provided above.

SUMMARY OF THE INVENTION

The present invention facilities verification of a system without lowering the speed of simulation in an apparatus capable of performing fast simulation in a system description language.

The present invention also facilitate performance analysis and verification of a large-scale complex system in transaction-level simulation.

In a preferred embodiment, an apparatus for performing transaction-level simulation is provided in which communications are performed over a bus by using a transaction, wherein the transaction has information indicating whether information is attribute information that is mapped to hardware or not and has attribute information that is not mapped to hardware.

In a further preferred embodiment a method for generating a log of transaction-level simulation is provide in which communication is performed over a bus by using a transaction, including the steps of receiving the transaction; reading attribute information that is mapped to hardware and attribute information that is not mapped to hardware from the transaction; and generate log data about simulation on the basis of the read attribute information.

Other features and advantages of the present invention will be apparent from the following description of the preferred embodiments.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1 shows bus transactions defined in AHB CLI;

FIG. 2 shows correspondence among transaction methods, attributes, and hardware;

FIG. 4 is a diagram for explaining a simulation using transaction methods;

FIG. 6 shows verification methods;

FIG. 9 shows a log 901 of transactions performed over a bus 806;

FIG. 16 is a diagram explaining differences in read processing time.

DETAILED DESCRIPTION OF THE PREFERRED EMBODIMENTS

Embodiments of the present invention will be described below in detail with reference to the accompanying drawings.

First Embodiment

In a first embodiment, functional modules, which are masters or slaves sending transactions, set attribute information as additional information that is not mapped to hardware and a bus which transfers transactions generates a simulation log based on the additional information.

Figure 3:
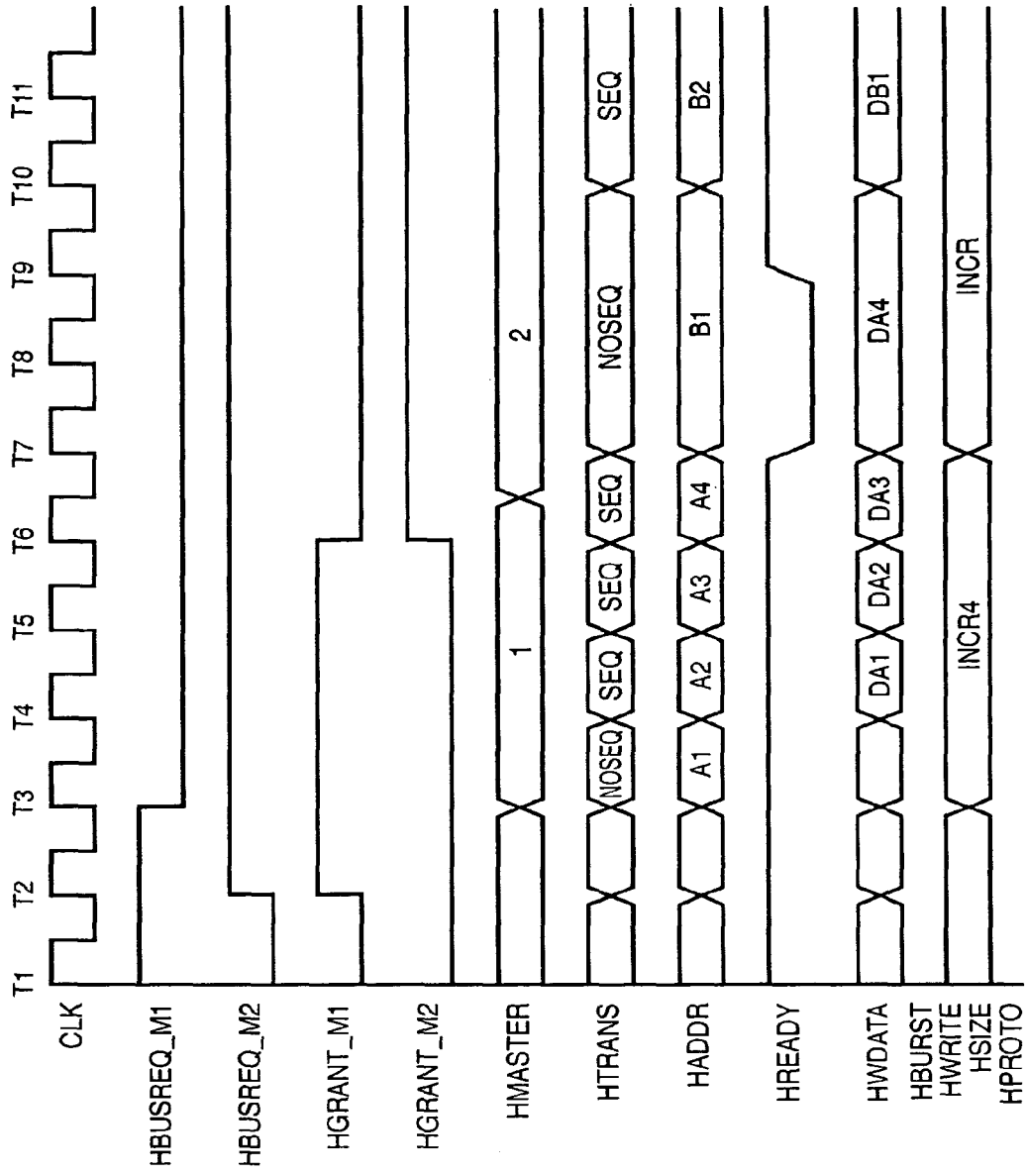
FIG. 3 shows correspondence between the transaction methods and signal waveforms.
Figure 5:
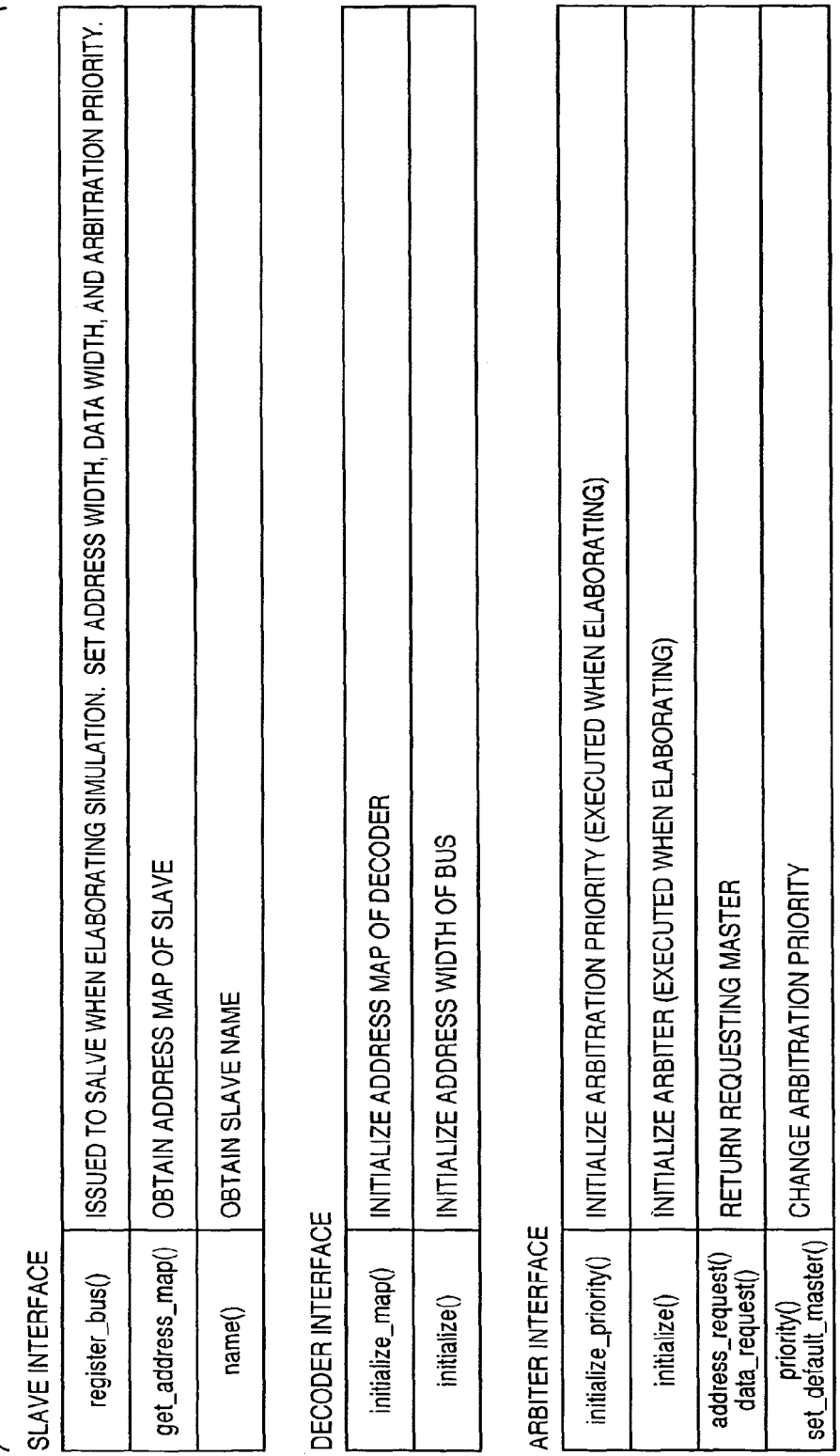
FIG. 5 shows hardware configuration methods.
Figure 7:
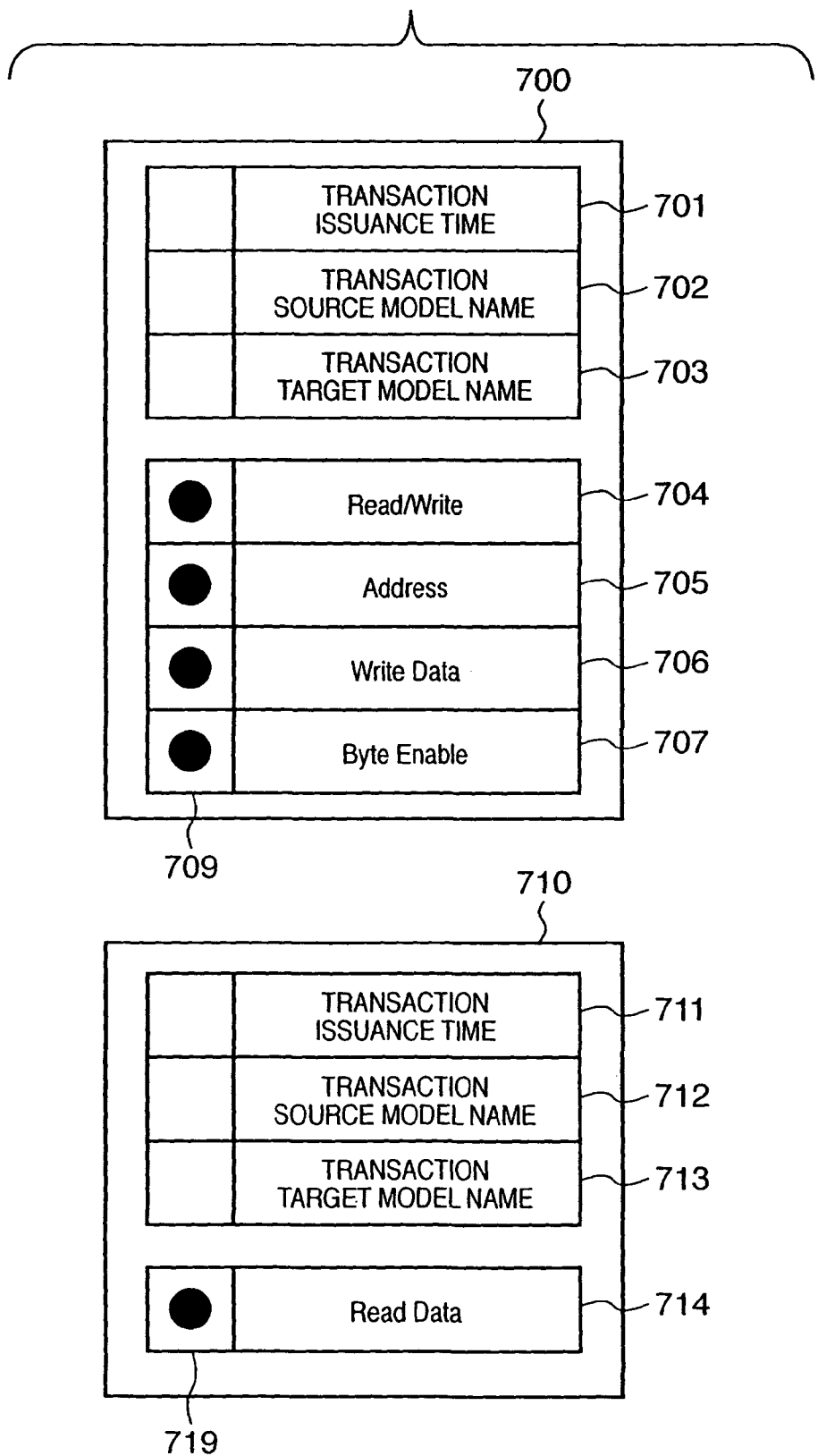
FIG. 7 shows an exemplary transaction configuration used in a simulation model according to a first embodiment.

FIG. 7 shows an exemplary transaction configuration used in a simulation model according to a first embodiment of the invention. A transaction 700, shown in FIG. 7, is an address transaction which is an access request from a master or bus to a slave. In the address transaction 700, reference numerals 701-703 denote attribute information that is not mapped to hardware bus signals. In the first embodiment, the following information is held as the attribute information.

The transaction issuance time 701 is the time at which the transaction has been issued, the transaction source model name 702 is the name of the model (module) issuing the transaction, and the transaction destination model name 703 is the name of the model to which the transaction is issued.

Reference numerals 704-707 denote attribute information that is mapped to hardware bus signals. The attribute information 704-707 is dependent on a bus protocol. Accordingly, attribute information included in an address transaction 700 varies depending on the type of the bus.

Reference numeral 709 denotes a mapping flag indicating whether or not the attribute information 701-707 is mapped to hardware bus signal. In the first embodiment, the hardware mapping flags 709 containing a black circle indicate that the attribute information is mapped to hardware and the hardware mapping flags 709 that do not contain a black circle indicate that the attribute information is not mapped to hardware.

Reference numeral 710 denotes a read data transaction, which is transferred over the bus in response to a read access request from a master or the bus. In the read data transaction 710, reference numerals 711-713 denote attribute information corresponding to the attribute information 701-703 described above. Reference numeral 714 denotes attribute information that is mapped to a hardware bus signal. Reference numeral 719 denotes a hardware mapping flag corresponding to the hardware mapping flag 709.

Figure 8:
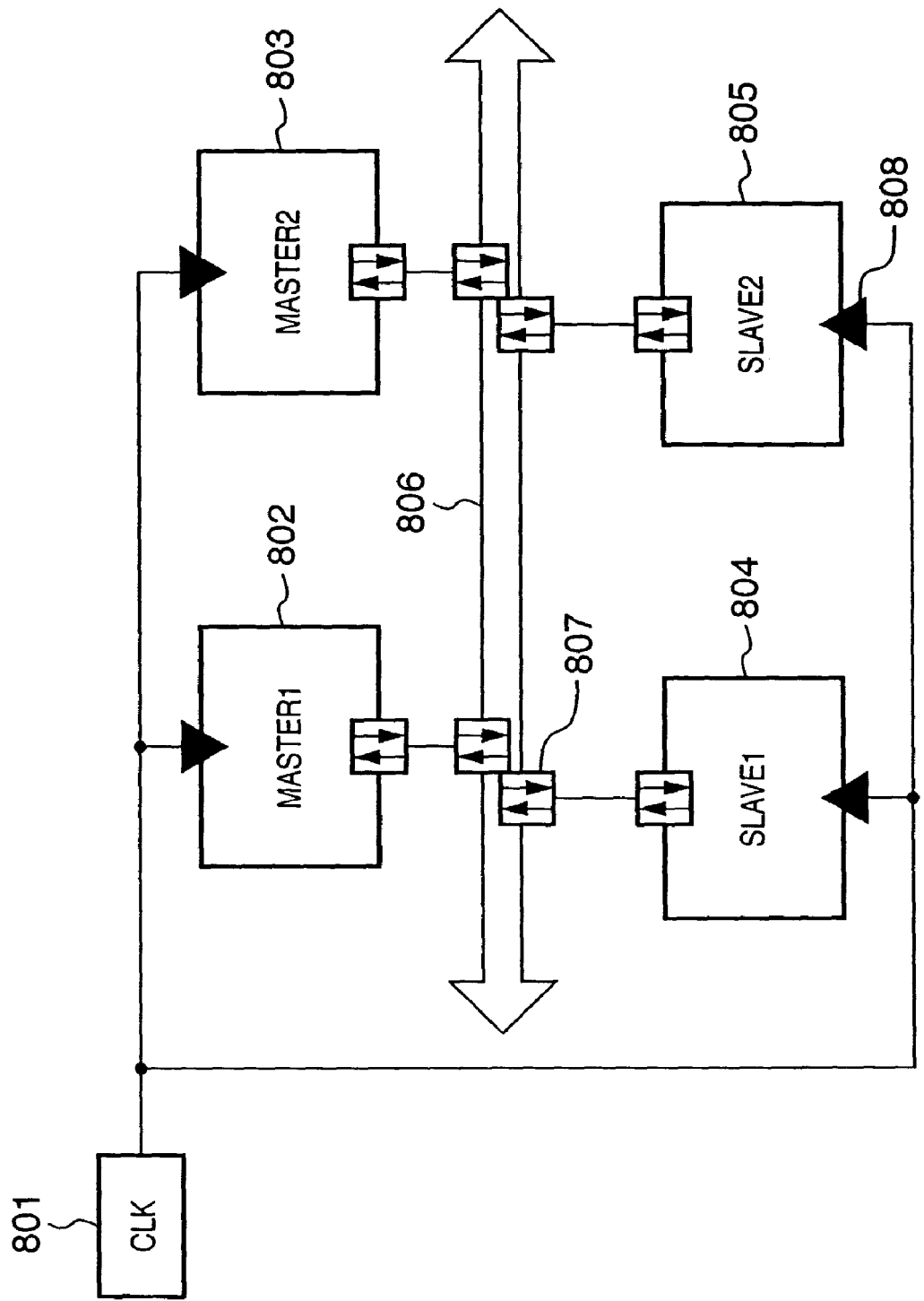
FIG. 8 shows a system configuration of the simulation model according to the first embodiment.

FIG. 8 shows an exemplary system configuration of a simulation model according to the first embodiment. In FIG. 8, reference numeral 801 denotes a clock generator, which provides a clock to functional modules (first and second masters and first and second slave, which will be described below).

Reference numeral 802 denotes a first master, which issues a transaction onto the bus and receives a transaction from a slave. Reference numeral 803 denotes a second master, which issues a transaction onto the bus and receives a transaction from a slave.

Reference numeral 804 denotes a first slave, which receives a transaction from the bus and issues a transaction, which is read data, in response to a read transaction. Reference numeral 805 denotes a second slave, which receives a transaction from the bus and issues a transaction, which is read data, in response to a read transaction.

Reference numeral 806 denotes the bus, which receives a transaction from the first master 802 or the second master, performs bus arbitration, decodes addresses, and transfers a transaction from the first master 802 or the second master 803 selected through bus arbitration to the first slave 804 or the second slave 805.

Reference numeral 807 denotes ports for performing transaction-based communications. Ports 807 are provided at the first master 802, second master 803, first slave 804, and second slave 805 and bus 806. Reference numeral 808 denotes a signal port for receiving a clock from the clock generator 801.

FIG. 9 shows a transaction log of the bus 806, which is a log of transactions transferred over the bus 806.

[Data Write]

A process for the first master 802 to write data into the first slave 804 in the configuration described above will be described below with reference to FIGS. 10 and 11.

Figure 10:
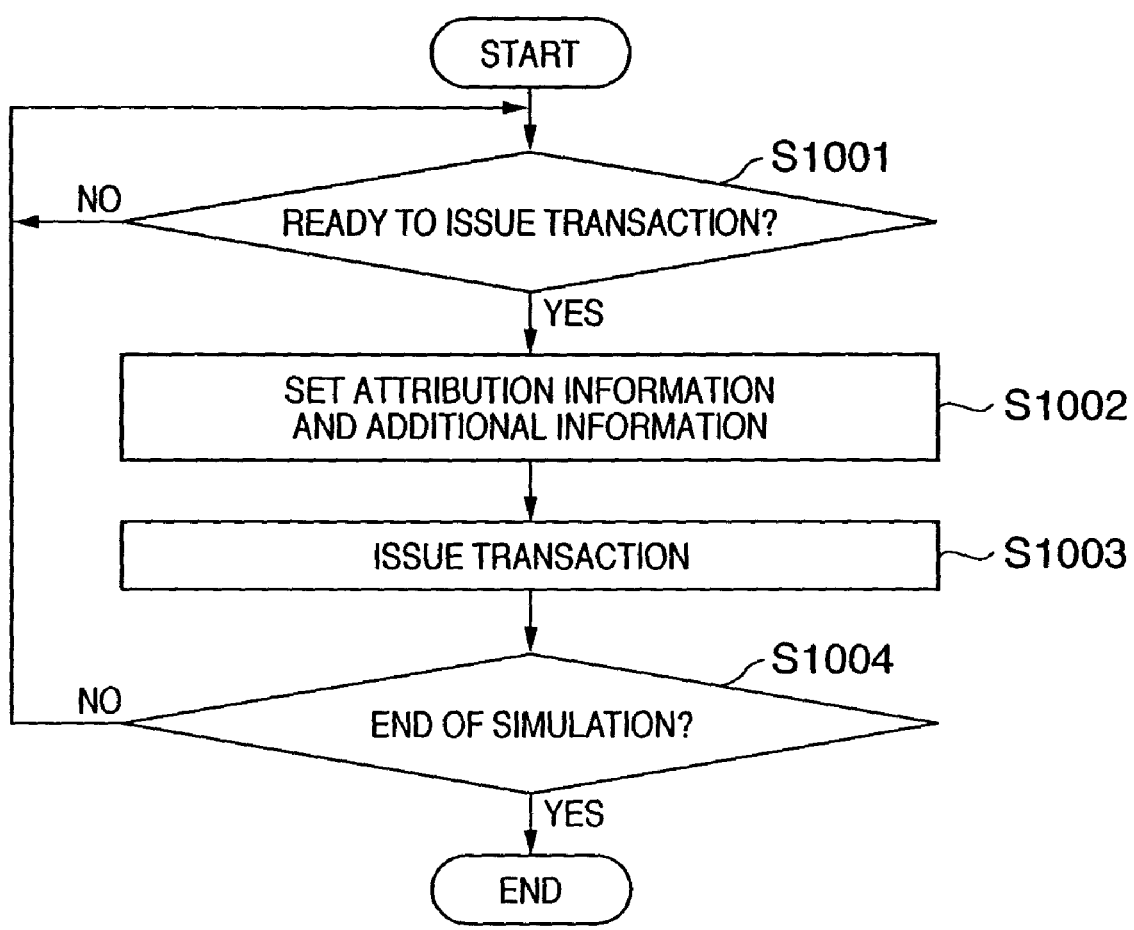
FIG. 10 is a flowchart of a process performed by a first master according to the first embodiment.

FIG. 10 is a flowchart of a process performed by the first master according to the first embodiment. FIG. 11 is a flowchart of a process performed by the bus according to the first embodiment.

When a simulation is started, at step S1001 the process proceeds to step S1002 to start issuing address transaction 700 if the first master 802 is ready for issuing a transaction onto the bus 806.

At step S1002, the first master 802 sets the values of attribute information 704-707 in the address transaction 700 that is mapped to (can be replaced with) hardware as follows:
READ/WRITE=WRITE;
ADDRESS=0xff00_0000;
WDATA=0x1234;
BYTE_ENABLE=0xffff;

The first master 802 also sets the values of attribute information 701-703 in the address transaction 700 that is not mapped to (cannot be replaced with) hardware as follows:
CURRENT_TIME=13:13:10;
SOURCE_MODEL_NAME=MASTER1;
DEST_MODEL_NAME=SLAVE1;

It should be noted that the hardware mapping flag 709 is fixed information and cannot be changed by the first master 802.

After the first master 802 sets the values of the attribute information 704-707 that can be replaced with hardware and the attribute information 701-703 that cannot be replaced with hardware, the first master 802 issues the address transaction 700 onto the bus 806 at step S1003.

On the other hand, if the bus 806 starts arbitration and grants the first master 802 access to the bus at step S1101, the bus 806 receives the address transaction 700 from first master 802.

Then, the bus 806 obtains the attribute information 701-703 unreplaceable with hardware at step S1102 and the attribute information 704-707 replaceable with hardware at step S1103.

At step S1104, the bus 806 decodes the address 705 in the attribute information 704-707 and transfers the address transaction 700 from the first 802 to the first slave 804.

At step S1105, the bus 806 adds the issuance time 701, the source model name 702, and the destination model name 703 in the attribute information 701-703 unreplaceable with hardware to the transaction log 901. At the same time, the bus 806 also adds the attribute information 704-707 replaceable with hardware to the transaction log 901.

Then the first slave 804 receives the address transaction 700 from the bus 806 and writes data at the appropriate address according to the address information 705, write data 706, byte enable 707 in the attribute information 704-707 replaceable with hardware.

[Data Read]

A process for the second master 803 to read data from the first slave 804 will be described below with reference to FIGS. 10 to 12.

Figure 11:
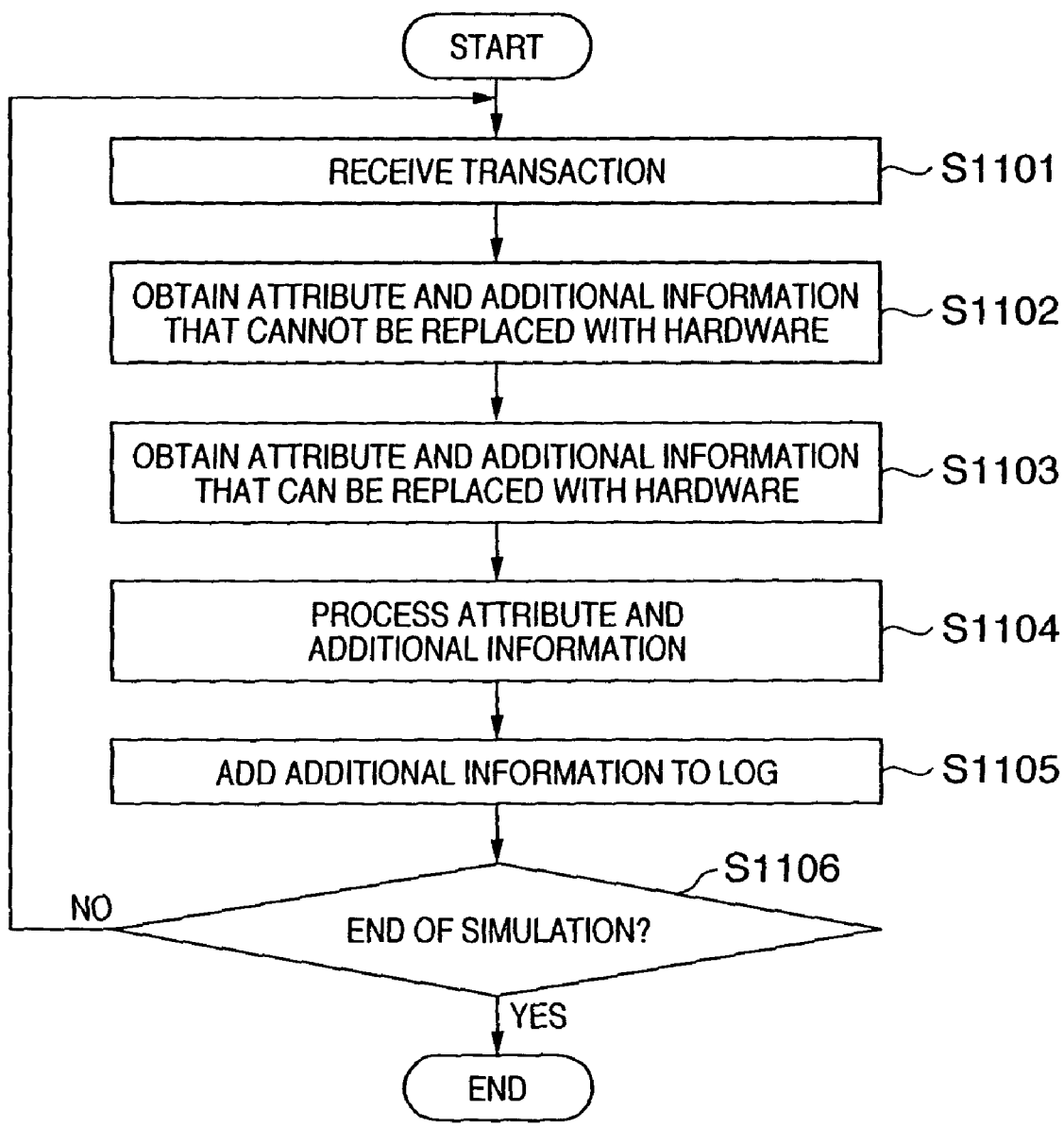
FIG. 11 is a flowchart of a process performed over the bus according to the first embodiment.

The process performed by the second master 803 is the same as that shown in the flowchart in FIG. 10 and the process performed by the bus 806 is the same as that shown in the flowchart in FIG. 11.

Figure 12:
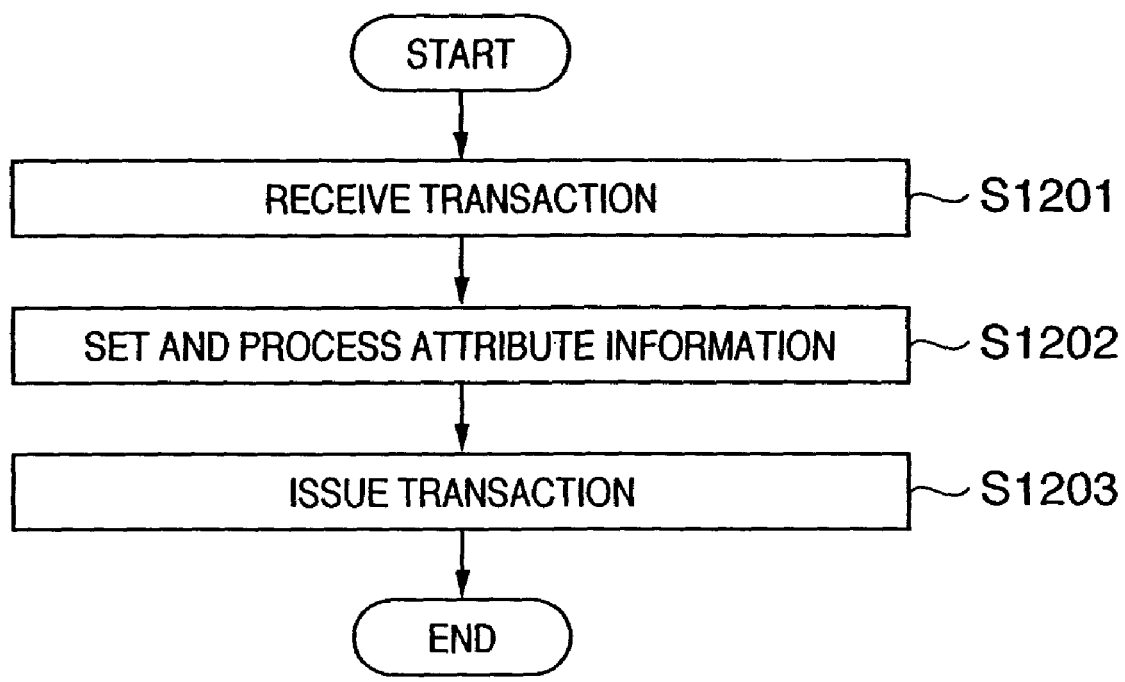
FIG. 12 is a flowchart of a process performed by a first slave 804 according to the first embodiment.

FIG. 12 is a process performed by the first slave 804 according to the first embodiment.

As in the case with the issuance of the address transaction 700 from the first master 802 described above, the second master 803 first issues an address transaction 700 onto the bus 806 (S1001 to S1003).

That is, the second master 803 sets the values of attribute information 704-707 replaceable with hardware as follows:
READ/WRITE=READ;
ADDRESS=0xff00_0000;
WDATA=;
BYTE_ENABLE=0xffff;

The second master 803 sets the values of attribute information 701-703 unreplaceable with hardware as follows:
CURRENT_TIME=13:13:20;
SOURCE_MODEL_NAME=MASTER2;
DEST_MODEL_NAME=SLAVE1;

When the bus 806 starts arbitration and grants the second master 803 access to the bus 806, the bus 806 receives the address transaction 700 from the second master 803 (S1101). Then, the bus 806 obtains and processes the attribute information 701-707 (S1102-S1104) in a manner similar to the write operation described above.

The bus 806 then adds the information about the address transaction 700 from the second master 803 to the transaction log 901 (S1105).

On the other hand, the first slave 804 receives the address transaction 700 from the bus 806 at step S1201, and reads data from the appropriate address according to the address 705 and byte enable 707 in the attribute information 704-707 replaceable with hardware at step S1202.

Then, the first slave 804 starts to issue a read data transaction 710 onto the bus 806 at step S1203.

First, the first slave 804 sets the value of hardware-replaceable attribute information 714 in the read data transaction 710 as follows:
RDATA=0x1234;

The first slave 804 also sets the values of hardware-unreplaceable information attribute information 711-713 as follows:
CURRENT_TIME=13:13:30;
SOURCE_MODEL_NAME=SLAVE1;
DEST_MODEL_NAME=MASTER2;

It should be noted that the hardware mapping flag 719 is fixed information and cannot by changed by the first slave 804.

Once the first slave 804 has set the hardware-replaceable attribute information 714 and the hardware-unreplaceable information 711-713 in this way, it issues the read data transaction 710 onto the bus 806.

On the other hand, when the bus 806 receives the read data transaction 710 from the first slave 804 (S1101), the bus 806 obtains the attribute information (S1102 and S1103) and transfers the read data transaction 710 from the first slave 804 to the second master 803 (S1104). Then, the bus 806 adds the information about the read data transaction 710 to the transaction log 901 (S1105).

After the completion of the simulation, the designer searches through and sorts the transaction log by using the transaction issuance times, transaction source model names, and transaction destination model names added to the transaction log 901 and determines whether the system has performed desired operations.

While the first embodiment has been described-with respect to a single bus, the present invention can also be applied to a system including more than one bus. In that case, simulation histories generated by the busses may be displayed individually or together and be searched through and sorted.

Because the hardware mapping flag indicating that information is equivalent to a hardware signal and attribute information that cannot be replaced with a hardware signal are provided, attribute information that cannot be replaced with hardware is generated by a module that issues a transaction, and attribute information that cannot be replaced-with hardware can be added by a module that receives the transaction as has been detailed above, the first embodiment can provide the following advantages.

(1) Simulation log can be readily accumulated by using attribute information unreplaceable and the visibility of the simulation log can be improved. Consequently, the time required for verification can be reduced.

(2) The simulation log can be readily searched through and sorted by using attribute information that cannot be replaced with hardware. Therefore, a designer can readily search for desired information and perform efficient verification.

Second Embodiment

A second embodiment of the present invention will be described below with reference to the accompanying drawings. In the second embodiment, a functional module, which is a slave module performing processing based on a transaction provided from a master adds simulation time to the transaction as attribute information that is not mapped to hardware.

Figure 13:
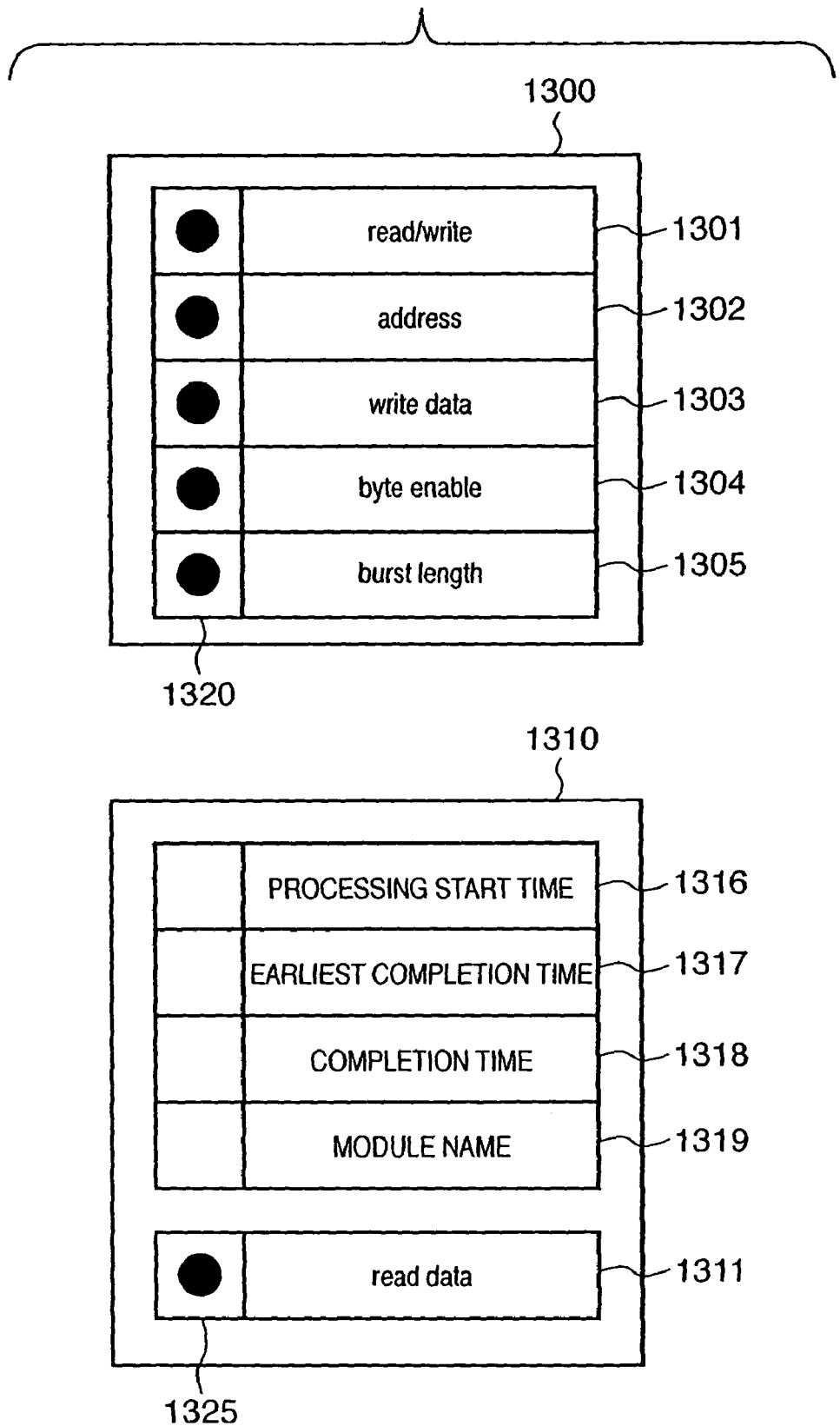
FIG. 13 shows an exemplary transaction configuration used in a simulation model according to a second embodiment.

FIG. 13 shows an exemplary transaction configuration used in a simulation model according to the second embodiment. In FIG. 13, reference numeral 1300 denotes an address transaction transferred over a bus and corresponds to an access request from a master or the bus to a slave. In the address transaction 1300, reference numerals 1301-1305 denote attribute information that is mapped to hardware bus signals. The attribute information depends on a bus protocol, that is, attribution information included in a transaction varies depending on the type of the bus.

Reference numeral 1310 denotes a read data transaction corresponding to read data provided in response to a read access request from the master or the bus. In the read data transaction 1310, reference numerals 1316-1319 denote attribute information that is not mapped to hardware bus signals. In the second embodiment, the following information is held.

The processing start time 1316, which is simulation time at which a functional module has received the read request address request, the earliest completion time 1317 which is simulation time at which the processing would be completed if there is no external factor that causes a delay in processing the read request, the process completion time 1318 which is simulation time at which the processing of the read request has actually been completed, and the name 1319 of the functional module that has issued the read data transaction.

Reference numeral 1311 denotes attribute information that is mapped to a hardware bus signal.

Reference numerals 1320 and 1325 denote hardware mapping flags which indicate whether or not the attribute information 1301-1305, 1311, and 1316-1319 are mapped to hardware bus signals. In the second embodiment, the hardware mapping flags 1320 containing a black circle indicate that the attribute information is mapped to hardware and the empty flags indicate that the attribute information is not mapped to hardware.

Figure 14:
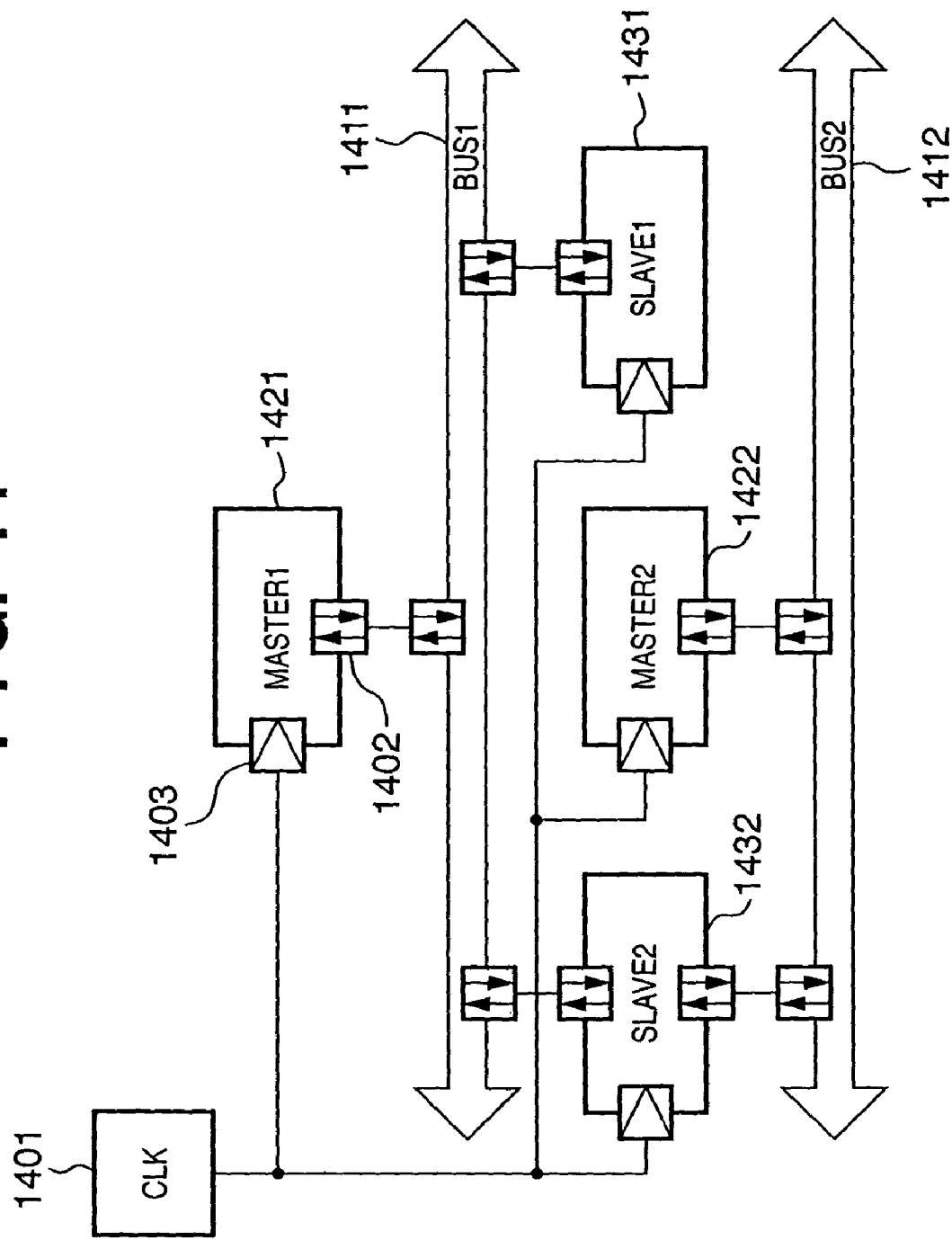
FIG. 14 shows an exemplary system configuration of a simulation model according to the second embodiment.

FIG. 14 shows an exemplary system configuration of a simulation model according to the second embodiment. In FIG. 14, reference numeral 1401 denotes a clock generator which provide a clock to the functional modules (a first master, a second master, a first slave, and a second slave, which will be described below) of the system.

Reference numerals 1411 and 1412 denote first and second buses of the system to be simulated, which receive transactions from functional module connected onto the busses as masters, perform bus arbitration, decode addresses, and transfer transactions from functional modules selected through bus arbitration to functional modules connected onto the busses as slaves.

Reference numeral 1421 denotes a first master, which is a functional module of the system. The first master 1421 is connected to the first bus 1411 as a master, issues transactions to the first bus 1411, and receives transactions from a slave.

Reference numeral 1422 denotes a second master, which also a functional module of the system. The second master 1422 is connected to the second bus 1412 as a master, issues transactions to the second bus 1412, and receives transactions from a slave.

Reference numeral 1431 denotes a first slave, which is a functional module of the system. The first slave 1431 is connected to the first bus 1411 as a slave, receives transactions through the first bus 1411, and issues transactions in response to transactions that represent reads from a master.

Reference numeral 1432 denotes a second slave, which is a functional module of the system. The second slave 1432 is connected to the first and second buses 1411 and 1412 as a slave, receives transactions from the first bus 1411 or the second bus 1412, and issues transactions that represent reads from a master.

Reference numeral 1402 denotes ports for performing transaction-based communications. Ports 1402 are provided at the first master 1421, the second master 1422, the first slave 1431, the second slave 1432, the first bus 1411, and the second bus 1412. Reference numeral 1403 denotes a signal port for receiving a clock from the clock generator 1401.

A process for the fist master 1421 reads data from the second slave 1432 in the configuration described above will be descried first.

When a simulation is started, the first master issues an address transaction onto the first bus 1411 if the first master 1421 is ready for issuing a transaction. The first master 1421 sets the values of attribute information 1301, 1302, and 1304 that is mapped to hardware for the address transaction 1300 as follows:

transaction.read_write.value=READ;
transaction.address.value=0x08000000;
transaction.byte_enable.value=0xf;

The value of hardware mapping flags 1320 of the address transaction 1300 is preset as shown below as read-only information which the first master 1421 cannot change.

transaction.read_write.hw_flag==true
transaction.address.hw_flag==true
transaction.write_data.hw_flag==true
transaction.byte_enable.hw_flag==true After the first master 1421 sets the attribute information, it issues the address transaction 1300, it issues the address transaction onto the bus 1411.

The first bus 1411 receives the address transaction 1300 from the first master 1421 and reads the values of the attribute information 1301-1305 that are mapped to the hardware for the address transaction 1300.

The first bus 1411 decodes the value of the address 1302 in the attribute information 1301-1305 that are mapped to the hardware, and transfers the address transaction 1300 from the first master 1421 to the second slave 1432.

If the second slave 1432 is ready for receiving a transaction through the first bus 1411, the second slave 1432 receive the address transaction 1300 and reads the values of the attribute information 1301-1305 that are mapped to the hardware for the address transaction 1300.

The second slave 1432 reads the data at the address according to the address 1302, byte enable 1304 and burst length 1305 in the attribute information 1301-1305 that are mapped to hardware.

The second slave 1432 then starts issuing a read data transaction 1310 to the first bus 1411.

In this example, the values of the attribute information 1311 that is mapped to the hardware for the read data transaction 1310 is as follows:

transaction.read_data.value=0x76543210;

Also, the values of the attribute information 1316 to 1319 that are not mapped to the hardware for the read data transaction 1310 is as follows:

transaction.model_name.value=SLAVE2;
transaction.start_time.value=120;
transaction.base_time.value=140;
transaction.done_time.value=140;

Here, start_time represents simulation time 1316 at which the second slave 1432 receives the address transaction 1300, which is a read request, and starts the read processing, base_time represents process completion time 1317 at which the read processing would be completed if there is no external factor that causes a delay in processing the read request, and done_time represents actual process 1318 completion time 1318 at which read processing for the read request has been completed.

Because there is no external factor that causes a delay in the read processing by the second slave 1432, the value done_time is the same as the value of base_time.

The value of hardware mapping flags 1325 of the address transaction 1300 is preset as shown below as read-only information which the second slave 1432 cannot change.

transaction.read_data.hw_flag==true
transaction.model_name.hw_flag==false
transaction.start_time.hw_flag==false
transaction.base_time.hw_flag==false
transaction.done_time.hw_flag==false After the second slave 1432 sets the attribute information 1311 that is mapped to hardware and the attribute information 1316-1319 that is not mapped to hardware, the second slave 1432 issues the read data transaction 1310 onto the first bus 1411.

The first master 1421 receives the read data transaction 1310 through the first bus 1411, reads the values of the attribute information 1311 that is mapped to hardware and the attribute information 1316-1319, and completes the read processing by performing internal processing in the first master 1421.

A case where the first master 1421 is making a read request to the second slave 1432 as described earlier while the second master 1422 is requesting a read of the second slave 1432.

The first master 1421 issues an address transaction, which is a read request, and the second slave 1432 receives the address transaction through the first bus 1411 and starts a read process.

However, the second slave 1432 has received a read request from the second master 1422 immediately before receiving the read request from the first master 1421. Therefore, the read process for the first master 1421 is placed and kept in the wait state until the read process for the second master 1422 is completed.

After the read process requested by the second master 1422 is completed, the second slave 1432 reads the values of attribute information 1301-1305 to be mapped to hardware for the address transaction 1300 from the first master 1421.

Then, according to the address 1302, byte enable 1304, burst length 1305 in the attribute information 1301-1305 that are mapped to hardware, the second slave 1432 reads data at the address.

Then, the second slave 1432 starts to issue a read data transaction 1310 onto the first bus 1411.

The value of attribute information 1311 that is mapped to hardware for the read data transaction 1310 is set as follows.
transaction.read_data.value=0xfedcba98;

Also, the values of attribute information 1316-1319 that are not mapped to the hardware for the read data transaction 1310 are set as follows:
transaction.model_name.value=SLAVE2;
transaction.start_time.value=370;
transaction.base_time.value=390;
transaction.done_time.value=410;

Here, the meanings of start_time, base_time, and done_time are as described above. The actual completion time done_time is later than base_time because when the second slave 1432 performs a read processing, the read process was in the wait state until the completion of the other read process.

The value of hardware mapping flags 1325 of the address transaction 1300 is preset as shown below as read-only information which the second slave 1432 cannot change.
transaction.read_data.hw_flag==true
transaction.model_name.hw_flag==false
transaction.start_time.hw_flag==false
transaction.base_time.hw_flag==false
transaction.done_time.hw_flag==false After the second slave 1432 sets the attribute information 1311 that is mapped to hardware and the attribute information 1316-1319 that is not mapped to hardware,-the second slave 1432 issues the read data transaction 1310 onto the first bus 1411.

The first master 1421 receive the read data transaction 1310 from the first bus 1411, reads the value of the attribute information 1311 that is mapped to hardware and the values of the attribute information 1316-1319 that are not mapped to hardware, and completes the read process by performing internal processing in the first master 1421.

A case where the first 1421 makes a read request to the first slave 1431 will be described below.

As in the data read described above, the first master 1421 issues an address transaction, which is a read request, and the first slave 1431 receives the address transaction through the first bus 1411 and starts a read process.

The first slave 1431 reads the values of attribute information 1301-1305 that are mapped to hardware for the address transaction 1300 and, based on the address 1302, byte enable 1304, and burst length 1305 in the attribute information, reads data at the address.

Then the first slave 1431 starts to issue the read data transaction 1310 to the first bus 1411.

The value of attribute information 1311 that is mapped to hardware for the read data transaction 1310 is set as follows.
transaction.read_data.value=0x332141100;

The values of attribute information 1316-1319 that are not mapped to the hardware for the read data transaction 1310 are set as follows.
transaction.start_time.value=610;
transaction.base_time.value=620;
transaction.done_time.value=620;
transaction.model_name.value=SLAVE1;

The meanings of start_time, base_time, and done_time are as described earlier. The difference between start_time and base-time is smaller than that in the second slave 1432 because the first slave 1431 can perform a read process faster.

The first slave 1431 is connected only to the first bus 1411 and therefore is not affected by the second master 1422 which is connected to the second bus 1412. Accordingly, the value of base_time is the same as the value of done_time.

The hardware mapping flags 1325 of the read transaction 1310 are held as described above. The first slave 1431 issues the read data transaction 1310 onto the first bus 1411.

The first master 1421 receives the read data transaction 1310 from the first bus 1411, read the value of the attribute information 1311 that is mapped to hardware and the values of the attribute information 1316-1319 that are not mapped to hardware, and completes the read process by performing internal processes in the first master.

Figure 15:
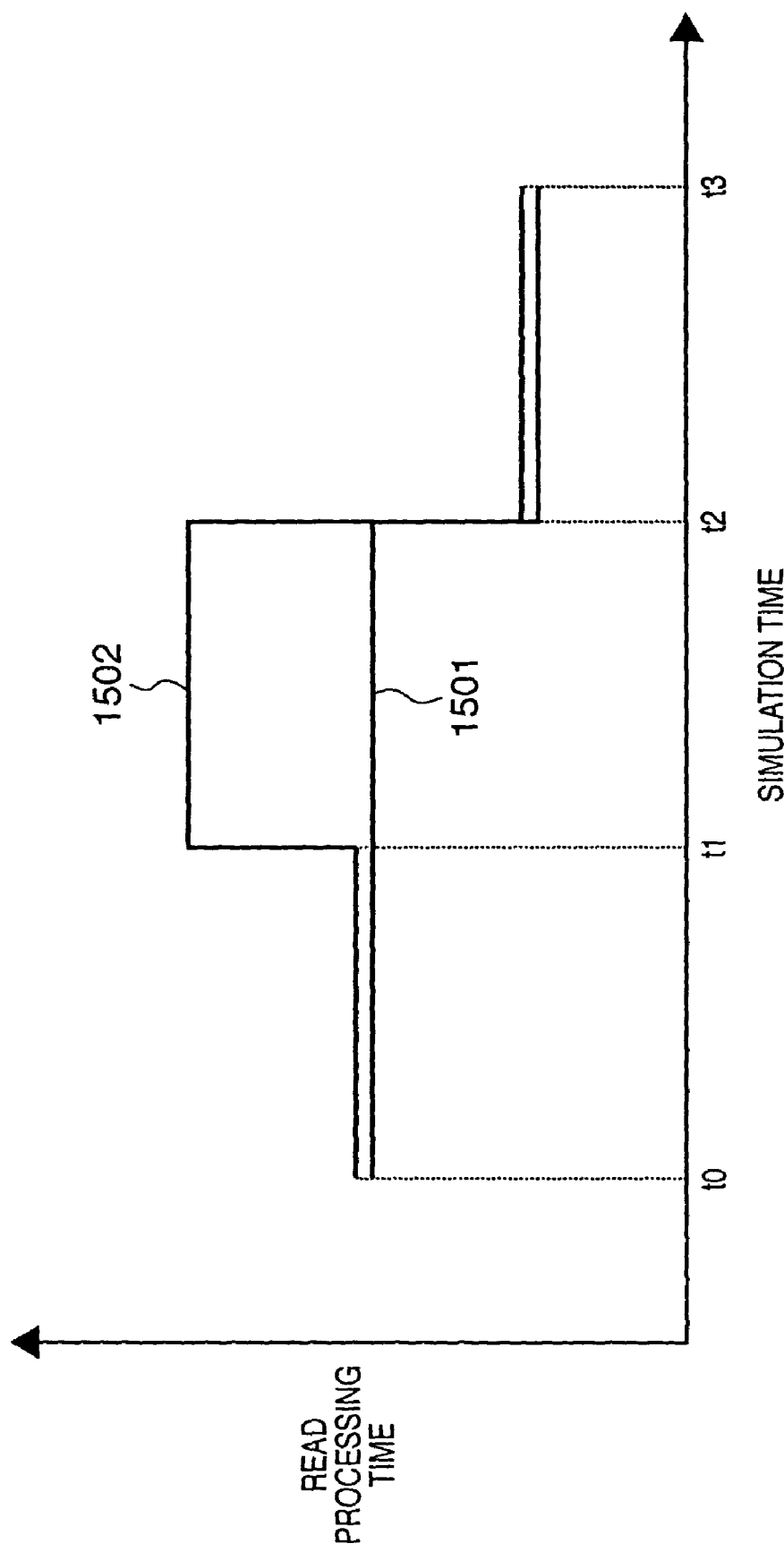
FIG. 15 is a diagram explaining differences in read processing time.

According to the second embodiment described above, the first master 1421 can obtain information about simulation time for read access from the first master 1421 to the first and second slaves 1431 and 1432 without needing a monitor using a dedicated interface. FIG. 15 shows a graph of the information. FIG. 16 shows access by the first master 1421 and the second master 14222 to the slaves.

The vertical axis of the graph shown in FIG. 15 represent time expended by a slave for read data processing requested by the first master 1421 and the horizontal axis represents simulation time.

In FIG. 15, line 1501 indicates read processing time plotted by subtracting processing start time 1316 from the earliest completion time 1317 (base_time-start_time) in the attribute information 1316-1319 that is not mapped to hardware in a read data transaction 1310 received from the slave. Line 1502 indicates read processing time plotted by subtracting processing start time 1316 from completion time 1318 (done_time-start time). This can show the read processing time 1501 that can be achieved if there is no delay-causing external factor and the read processing time 1502 that can be achieved by a real slave.

The vertical axis in FIG. 16 indicates the types of masters. M1 denotes a first master 1421 and M2 denotes a second master 1422. The horizontal axis indicates simulation time.

In FIG. 16, line 1601 indicates that the first master 1421 is accessing a second slave 1432 (S2) during the period from simulation time t0 to t2. Line 1602 indicates that the first maser 1421 is accessing a first slave 1431 (S1) during the period from simulation time t2 to t3.

Line 1603 indicates that the second master 1422 is accessing the second slave 1432 (S2) during the period from simulation time t1 to t3. It should be noted that the second master 1422 is not accessing any slave during the period from simulation time t0 to t1.

As can be seen from FIGS. 15 and 16, the read processing in the period between t0 and t1 is performed without an extra delay, the read processing in the period between t1 and t2 is performed with an extra delay under the influence of the second master 1422, and the read processing in the period between t2 and t3 is performed without an extra delay.

It can be seen at a glance that there is no extra delay in the read processing in the period between t0 and t1 and the read processing in the period between t2 and t3, although they take different times.

These pieces of information cannot be obtained by measuring at the masters the time required for read processing requested to the slaves. Especially, information indicating the processing time in which a delay is not caused by an external factor is held only in the slaves. This information is obtained through existing ports for communicating transactions without using a special interface.

Thus, a functional module that has received a transaction can obtain information internally held by a slave simply by referring to the attribute information about the transaction. This eliminates the need for using a complex mechanism in which monitors are provided in all slaves which transactions can reach, information is obtained through a special interface, and the information is shared among the monitors.

As has been described above, the second embodiment makes it possible to add to a transaction a hardware flag indicating that the transaction corresponds to a hardware signal and information unrelated, and to add to a module that issues the transaction so that another module receiving the transaction can use the added information. Therefore, the second embodiment provides the following advantages.

(1) Information that would not be able to be obtained unless information held in a functional module can be obtained. This allows a system designer to perform performance analysis and verification with significantly improved efficiency. Especially, the designer can readily know whether latency spent by a functional module between reception of a processing request from another functional module and completion of the processing was caused by contention with another functional module or whether the latency is a minimum latency essentially required by that module. Consequently, the efficiency of performance analysis by the designer can be improved.

(2) The designer can check required information on a bus or in functional module being simulated by extending existing transaction handling methods without having to provide methods dedicated to monitors for obtaining required information. Also, this can avoid an increase of the number of events due to calls to methods dedicated to monitors and consequently reduction in simulation speed.

The present invention may be applied to a system consisting of multiple devices (such as a host computer, an interface devices, a reader, and a printer) or may be applied to a standalone apparatus (such as a copying machine or a facsimile machine).

The objects of the present invention can also be achieved by an implementation in which a recording medium on which a software program code that implements the functions of the embodiments described above is recorded is supplied to a system or an apparatus and a computer (CPU or MPU) of the system or apparatus reads and executes the program code stored on the recording medium.

In that case, the program code read from the recording medium implements the functions of the embodiments and the recording medium on which the program code is stored constitutes the present invention.

The recording medium for providing the program code may be a floppy disk, a hard disk, an optical disk, a magneto-optical disk, a CD-ROM, a CD-R, a magnetic tape, a non-volatile memory card, or a ROM, for example.

The functions of the embodiments described above can be implemented by a computer reading and executing the program. The functions of the embodiments described above can also be implemented by processing by an OS running on the computer which performs part or all of actual processing of the embodiments.

Furthermore, the present invention also includes an implementation in which, after the program code read from the recording medium is loaded into a memory included in a function expansion board inserted in a computer or a memory in a function expansion unit attached to a computer, a CPU included in the function expansion board or function expansion unit performs part or all of the actual processing according to instructions in the program code and the functions of the embodiments are implemented by the processing.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-262953 filed on Sep. 9, 2004, the entire contents of which are hereby incorporated by reference herein.

What is claimed is:

1. A method for performing transaction-level simulation in which communication over a bus is performed by using a transaction, the method comprising:

issuing a first transaction, the first transaction being issued by a first functional module, wherein the first transaction includes attribute information that is mapped to hardware and attribute information that is not mapped to hardware;

receiving the first transaction, the first transaction being received by a second functional module;

performing a process requested by the first transaction, the process being performed by the second functional module;

issuing a second transaction to a bus, the second transaction being issued to the bus by the second functional module, wherein the second transaction includes attribute information that is mapped to hardware and attribute information that is not mapped to hardware;

receiving the second transaction from the bus, the second transaction being received by the first functional module;

reading first and second time information, which is related to the second transaction and is included in the attribute information that is not mapped to hardware, from the received second transaction, wherein the first time information is related to time taken to complete the process requested by the first transaction, and the second time information is related to an expected time at which the process requested by the first transaction would be completed if there is no external factor that causes a delay in completing the process requested by the first transaction; and generating a data log based on the first and second time information.

2. The method according to claim 1, wherein the generation of the data log is performed on the bus.

3. The method according to claim 1, wherein the attribute information that is not mapped to hardware included in the second transaction further includes the time at which the second transaction has been issued by the second functional module.

4. The method according to claim 1, wherein the attribute information that is not mapped to hardware included in the second transaction further includes the time at which the second transaction has been received by the first functional module.

5. A method for performing transaction-level simulation in which communication over a bus is performed by using a transaction, the method comprising:
- issuing a first transaction, the first transaction being issued by a first functional module, wherein the first transaction includes attribute information that is mapped to hardware and attribute information that is not mapped to hardware;
- receiving the first transaction, the first transaction being received by a second functional module;
- performing a process requested by the first transaction, the process being performed by the second functional module;
- issuing a second transaction, the second transaction being issued by the second functional module, wherein the second transaction includes attribute information that is mapped to hardware and attribute information that is not mapped to hardware;
- receiving the second transaction, the second transaction being received by the first functional module;
- reading first and second time information, which is related to the second transaction and is included in the attribute information that is not mapped to hardware, from the received second transaction, wherein the first time information is related to time taken to complete the process requested by the first transaction, and the second time information is related to an expected time at which the process requested by the first transaction would be completed if there is no external factor that causes a delay in completing the process requested by the first transaction; and
- outputting a simulation result based on the first and second time information.

* * * * *